United States Patent [19]
Crouch et al.

[11] Patent Number: 5,383,143
[45] Date of Patent: Jan. 17, 1995

[54] SELF RE-SEEDING LINEAR FEEDBACK SHIFT REGISTER (LFSR) DATA PROCESSING SYSTEM FOR GENERATING A PSEUDO-RANDOM TEST BIT STREAM AND METHOD OF OPERATION

[75] Inventors: Alfred L. Crouch; Matthew D. Pressly, both of Austin, Tex.

[73] Assignee: Motorola, Inc., Schaumburg, Ill.

[21] Appl. No.: 220,348

[22] Filed: Mar. 30, 1994

[51] Int. Cl.6 ............................................. G06F 1/02
[52] U.S. Cl. ................................................... 364/717
[58] Field of Search ...................... 364/717; 331/78; 380/46; 340/146.2

[56] References Cited

U.S. PATENT DOCUMENTS

| | | | |
|---|---|---|---|
| 4,791,594 | 12/1988 | Harney et al. | 364/717 |
| 5,258,936 | 11/1993 | Gallup et al. | 364/717 |
| 5,327,365 | 7/1994 | Fujisaki et al. | 364/717 |

*Primary Examiner*—Tan V. Mai
*Attorney, Agent, or Firm*—Keith E. Witek

[57] ABSTRACT

A data processing system (10) has a test controller (12). The test controller (12) has a pattern generator (18) for receiving a seed value and generating many pseudo-random values from the seed value. A re-seed and compare circuit (22) monitors the pattern generator (12) and determined when the seed value repeats in the pseudo-random number sequence generated by the generator (18). Once circuit (22) determines that the seed value has repeated the control circuit (20) allows the generator (18) to clock once more and latches a new seed value into the circuit (22). Therefore, the pattern generator through the compare/store function of circuit (22) and the control of circuit (20) is self re-seeding and generates a longer string of pseudo-random numbers with minimal logic.

23 Claims, 5 Drawing Sheets

SELF RE-SEEDING LINEAR FEEDBACK SHIFT REGISTER (LFSR) DATA PROCESSING SYSTEM FOR GENERATING A PSEUDO-RANDOM TEST BIT STREAM AND METHOD OF OPERATION

FIELD OF THE INVENTION

The present invention relates generally to electrical circuits, and more particularly, to linear feedback shift register circuits.

BACKGROUND OF THE INVENTION

The trend in modern microprocessor integrated circuits is to move to higher and higher levels of integration and smaller physical structures. Much of what used to be board level circuitry and additional co-processing integrated circuits has now been moved within a single microprocessor chip. The impetus for incorporating more and more circuitry and functions within single chips are the design goals of reduced size (more functionality within a reduced footprint), more speed (higher operating clock frequency), and improved performance (processing of more functional operations in a smaller time period). Other goals may also include reduced power consumption, reduced cost, and targeted market stipulations.

As the amount of logic contained within a single integrated microprocessor grows, other engineering issues also become a concern. With multiple level metal layers and buried logic structures in the physical device (logic located on the integrated circuit that has limited accessibility both logically and physically), as well as integration levels in the millions of transistors, issues such as manufacturability, reliability, and testability become more important and also become more costly items in the overall product cycle.

Several methods have been applied to address these issues. At first the board level testability methods that incorporated observability and controllability were moved into the integrated circuit along with the board level functionality. These methods were know as Ad Hoc testability and included such methods as discrete test points, data capture registers, and other invasive circuitry. These methods were shown to be costly in area, highly inefficient for overall testability, and affected performance in a negative manner.

To become more efficient, the VLSI and microprocessor fabrication industry began to use structured testability methods such as partial scan/full scan to provide controllability and observability of internal nodes of the integrated circuits. The scan methodology is excellent for conducting overall product test using an external tester which is usually very expensive. The external tester can determine faults resulting from the silicon manufacturing process, fabrication test; and determine faults due to the dicing and packaging process, manufacturing test. The external tester does not fully address other test environments such as burn-in (determining faults that cause infant mortality due to the stresses of first applying power, voltage, current, and the effects of operating temperature, to the device under test) and self-contained diagnostic or confidence testing.

Another method used to address manufacturing test and the other test environments was Built-In-Self-Test (BIST). In its original form designs were also taken from the circuit board level environment and were implemented using conventional implementations of Linear FeedBack Shift Registers (LFSRs) to provide pseudo-random patterns to sections of integrated circuit logic wherein "pseudo-random" means that the patterns created by an LFSR are repeatable for a given starting point. Eventually, the conventional LFSR was also coupled with the use of conventional scan to allow the pattern generation process to provide information for conventional scan chains.

The problem with the existing conventional methodologies and current art is that they are aimed at conducting tests targeting manufacturing level fault coverage, which can be viewed as a replacement manufacturing test. Since this type of testing is just as easily done with an external tester, the BISTs designed like this are grossly inefficient in engineering goals such as logic or die area impact and performance impact to the functional operations. There have been many papers published concerning creating tests that have higher fault coverage by using methods such as changing seeds (initial values) and polynomials (feedback connections to a serial shift register) during testing. The result of implementing the algorithms described in the literature are pattern generators that have high register counts, many levels of multiplexors to allow many different polynomials to be installed, multiple memories to hold the seeds and polynomial values, and multiple counters to sequence and synchronize all operations of the pattern generator. A common example of this is the Built-In-Logic-Block-Observer (BILBO).

The biggest problems of conventional pattern generators and test controllers based on these structures are that they take up a lot of physical area and may not be able to run at the rated frequency of the device-under-test due to the complexity involved with fetching and installing seeds and polynomials in an LFSR. The most common Test Controller design requires a LFSR and two or more equal length counters. One counter is used to determine when the LFSR has cycled through one seed value, another counter is used to determine when the LFSR has cycled through all possible seeds, and more counters are needed if the polynomial is changed (requiring at least three registers, but usually more in order to be practical, as shown below). Polynomials and seeds are usually stored so that they can be applied in some pre-determined order. This order requires even more counters, or memory storage devices in addition to those listed above. The inclusion of a memory storage device also requires control logic to activate the memory access at the correct point in the testing sequence so that the seed or polynomial is installed at the correct time. This means that a test controller circuit based on a 16-bit PRPG LFSR will require a 16-bit counter to identify when the first seed has completed, another 16-bit counter to count when the set of seeds has completed, a 16-bit by $2^N$ memory to store the $2^N$ possible seed values, a 16-bit register to apply the polynomial feedback terms to the 16 shift register bits (through 16 multiplexers), a 16-bit by M memory to store the M possible polynomial values, a counter or state machine to identify when to change the polynomial, and the control logic necessary to operate the memory and install the seed and polynomial values to the various registers. This is quite a bit of logic to include within an integrated circuit just to accomplish a Built-In Self-Test.

Even more complexity is added to the above described circuit if it also must coordinate and sequence a scan architecture and LFSR based signature analyzers. This means that the PRPG LFSR must supply patterns to the scan chain or chains until they are full and then establish the mode, enable, select, or clock signals necessary to accomplish a sample cycle (just shifting data through the scan shift chains is not a sufficient test). Once the chips response to the shifted in scan state is sampled into the scan chain, the data must be processed to evaluate if any resulting data is correct or not. This is usually done by compressing the data into a conventional signature analyzer or data compression circuit. Counters must be provided to indicate to the scan architecture when it is the proper time to conduct the sample cycle, counters must be provided to enable the data compression device (so that it does not sample random or indeterminate data, such as the default power-up state, that can occur before the first PRPG pattern fills the scan chain with known deterministic values), and counters must be provided to indicate when the test is finished so that the signature analyzers may be stopped so that the signature is frozen and the value held by the signature analyzer is independent of the number of clock cycles applied. Any attempt to use the current art type of structure to accomplish a complete all encompassing scan based self-test just adds more logic and complexity. All of the advances to this kind of methodology cost more circuit area and impacts functional performance which is not acceptable to modern design goals.

SUMMARY OF THE INVENTION

The previously mentioned disadvantages are overcome and other advantages achieved with the present invention. In one form, the present invention comprises a method for providing a sequence of pseudo-random bits. The method begins by loading a first storage circuit with a seed value. The seed value is altered in the first storage circuit in a manner which allows the first storage value to generate N pseudo-random bit values starting from the seed value. The N pseudo-random bit values eventually reach a point in time where the N pseudo-random bit values repeat. When the seed value repeats in the first storage circuit, this repeating is detected via a second storage circuit. The first storage circuit clocks at least once to select a next seed value within the first storage circuit. The next seed value, as selected by the first storage circuit, is stored in the second storage circuit. The above steps are repeated a predetermined number of times.

In another form, the invention comprises a data processing system having circuit means for manipulating data, a first storage device, and a second storage device. The circuit means for manipulating data has digital storage devices. The first storage device is coupled to the circuit means for manipulating data. The first storage device has N bits and generates a set of M unique logic values in a cyclic manner wherein $2 \leq M \leq 2^N$. The second storage device has N bits which stores one of the M unique logic values from the first storage device as a seed value, and recognizes when the seed value repeats in the first storage device. The second storage device stores a different one of the M unique logic values from the first storage device as a new seed value when the seed value repeats.

The present invention will be more clearly understood from the detailed description below in conjunction with the accompanying drawings.

Figure 1:
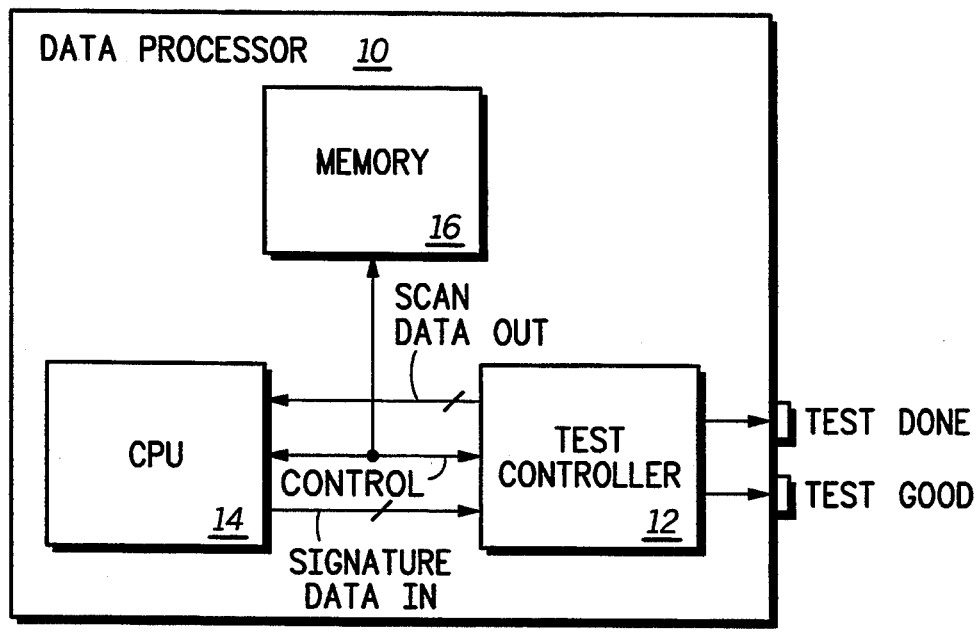
FIG. 1 illustrates, in a block diagram, a data processing system in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

The present invention provides a Built-In-Self-Test (BIST) controller for use with a full-scan (SCAN) design circuit that is based upon a self-reseeding linear feedback shift register (LFSR) and uses a minimum logic implementation and method thereof. The self reseeding taught herein is a very efficient design which has a large degree of functionality in a small circuit surface area.

Generally, a SCAN can be applied to any circuit that is structured in such a way that all of the sequential elements (flip-flops or latches) can be connected together (usually in some serial fashion) to form a scan shift register. This allows the state of the circuit to be set by serially shifting data into the sequential elements. Once the state is set by shifting data in to the circuit, the scan shift register allows for capture of the circuits response to the scanned-in-state by transitioning a control signal that makes the sequential elements capture data from their functional inputs instead of the scan inputs. The captured data can then be shifted out of the circuit to an external test circuit or external user for test purposes. The application of serial state data, transitioning of the control signal or signals, and the collection of the serial response data is usually conducted by a circuit tester external to the part incorporating the. A controller within a circuit gives test extremely broad capability within the circuit, instead of requiring an expensive external tester with potentially less access to circuitry internal to the circuit incorporating the. Therefore, a SCAN controller: (1) provides test data that is usually serially fed into the scan chains; and (2) provides all control signals that orchestrate the sequencing and operation of the target scan chains so that they may: receive, shift, and apply the scan data; conduct a sample of the circuits response to the applied data at the correct time; and provide a method by which the response can be shifted out of the scan chain and evaluated or verified for correctness. The invention described here provides all of these elements in a novel circuit/manner in which many circuit elements/blocks are shared so that far fewer logical circuit elements are used than the current known state-of-the-art implementations.

The current invention uses a linear feedback shift register (LFSR) to create pseudo-random patterns from an initial seed (starting state). Also, the novel LFSR described herein uses the tact that an LFSR, having N bits of storage, cycles through all possible $[(2^N)-1]$ binary states, except the all zero state, to create it's own next and different seed value. Therefore, the LFSR provides $[(2^N)-1]$ values for one seed (i.e., the first seed). The LFSR is designed herein to choose one of these $[(2^N)-1]$ values as a next new seed which is numerically different from the first seed in order to generate $([(2^N)-1])$ more pseudo-random numbers in addition to the $[(2^N)-1]$ pseudo-random numbers generated via the first seed. Therefore, the LFSR taught herein can generate approximately $([(2^N)-1])*([(2^N)-1]) \approx 2^{2N}$ unique pseudo-random values via $[(2^N)-1]$ seeds by re-seeding itself (i.e., replacing an old seed with a new seed wherein the new seed is selected from a pseudo-random number generated by the LFSR when using the old seed).

Specifically, the next/new seed value is installed by allowing a second register, that is of equal length to the LFSR, to capture a state (i.e., a pseudo-random number) from the LFSR that is not equivalent to the previous/old seed. This value is used as a compare value to indicate when the next seed value must be captured and when the scan chain control signals must be applied. This is significantly different than the common method of storing a set of seeds (initial states) or polynomial values (feedback connections) in N RAM or ROM memory elements and providing means to access and apply these stored values. It is also different from the other common methods that rely on creating seed values or polynomial values by using counters. The method of this invention uses far fewer logical circuit elements in it's implementation of overall data generation than either the RAM/ROM storage method or the counter method and consequently reduces the amount of circuitry needed.

The following is an example:

Assume we have a LFSR which can represent four states 1, 2, 3, and 4 in a pseudo-random fashion given a initial value or seed value of 1, 2, 3, or 4. Assume that a 1 is applied as a seed to the LFSR. The 1 is stored in the LFSR and the seed 1 is stored in a compare register (COMP) and the following pseudo-random sequence results:

| LFSR | COMP |
| --- | --- |
| 1 (loaded with seed value) | 1 (loaded) |
| 3 (after one clock cycle) | 1 |
| 2 (after two clock cycles) | 1 |
| 4 (after three clock cycles) | 1 |
| 1 (seed value repeated @ fourth clock cycle) | 1 |

At the fourth clock cycle control circuitry determines by comparing the LFSR with the COMP register that the seed has repeated and the pseudo-random sequence is exhausted. The control circuitry then chooses another number other than one from 1, 2, 3, and 4 as the new seed. This choice can be performed in many manners although by choosing the next number (3) after the old seed (1) a quick and efficient method of seed replacement is derived. Therefore, the LFSR and the COMP are equal at the fourth clock cycle and the COMP register is changed to the next pseudo-random value occurring after 1, which is equal to 3. This 3 value is the new seed loaded into COMP and the LFSR and the pseudo-random generation continues:

| LFSR | COMP |
| --- | --- |
| 3 (loaded with seed value) | 3 (loaded) |
| 2 (after one clock cycle) | 3 |
| 4 (after two clock cycles) | 3 |
| 1 (after three clock cycles) | 3 |
| 3 (seed value repeated @ fourth clock cycle) | 3 |

Therefore, another set of four pseudo-random numbers is generated. The control logic then picks the number after 3, which is 2, as the new seed and the following sequence results:

| LFSR | COMP |
| --- | --- |
| 2 (loaded with seed value) | 2 (loaded) |
| 4 (after one clock cycle) | 2 |
| 1 (after two clock cycles) | 2 |
| 3 (after three clock cycles) | 2 |
| 2 (seed value repeated @ fourth clock cycle) | 2 |

The next sequence picks 4 as a seed and results in:

| LFSR | COMP |
| --- | --- |
| 4 (loaded with seed value) | 4 (loaded) |
| 1 (after one clock cycle) | 4 |
| 3 (after two clock cycles) | 4 |
| 2 (after three clock cycles) | 4 |
| 4 (seed value repeated @ fourth clock cycle) | 4 |

The cycle is now complete and the sequential pseudo-random output of the 4 state LFSR using one backup register (a total of only two registers) is 1 3 2 4 3 2 4 1 2 4 1 3 4 1 3 2 or 3 2 4 1 2 4 1 3 4 1 3 2 1 3 2 4 depending upon which cycle within each of the four pseudo-random sequences above is ignored. For example, in the first sequence, wherein 1 is the seed, 1 is repeated twice (once in the beginning when loaded and once at the end to determine repetition). One of these two occurrences of 1 is ignored to get one of the two 16 value non-repeating pseudo-random sequences given above. These states 1, 2, 3, and 4 may be implemented as binary bits wherein each bit can be viewed as a random digit thereby creating a very long stream of pseudo-random 0's and 1's.

In the current invention, the control logic that implements the self-reseeding circuit for the LFSR also provides the logic signals needed for scan chain control and sequencing and applies them at the correct time, because the re-seeding (i.e., the ignored sequence) of the LFSR naturally occurs during the scan sample cycle when signatures are updated. This eliminates the need to have a separate scan timing counter to apply the sample pulse at the correct point in time and eliminates the step of synchronizing the scan timing counter and the LFSR. Also, since the LFSR of the present invention itself produces each different seed, when the LFSR completely cycles through all states and repeats the first seed value, it is the LFSR itself that provides the signal that the whole Scan test is completed. This eliminates the need for a second counter used to keep track of how many scan samples have occurred to indicate the end of the Scan test. In the present invention, the first re-seeding signal and the LFSR completion signal are also used to enable and shut off the verification devices (signature analyzers). This saves even more logic that otherwise would be necessary in conventional designs.

To further summarize the description above, the present invention can implement a complete Scan controller at a logic cost of two equal length N-bit registers, three single flip-flops for all control signals, and one flip-flop for re-seeding control. All external scan chain and signature analyzer control signals are generated automatically as a consequence of control signals needed internally to the Scan controller since the LFSR itself is the basis of all actions.

For the case of the currently known prior art Scan controller, for a Scan controller that can conduct the exact same test, the requirements are one N-bit LFSR, one equal length N-bit register to act as a counter for the length of the scan vector, another equal length N-bit counter to act as a number of scan vector counter, and either an N×(N-1) memory element to store N-1 seeds of N-bit length, or an N-bit counter or state machine to generate N-1 seeds. On top of this the scan chain control and signature analyzer control signals must also be generated and care must be taken to synchronize the LFSR to the length of test counters so that the scan data that is generated is applied correctly (since test sequence control is usually based on the counter and not the LFSR). At a minimum then this costs at least one more equal length register and is much more complex in it's working and procedure than the current invention. Another concern for the prior art Scan controller is that the new seed, which may be stored in a memory element, needs to be installed at the right point in the test sequence. This requires even more circuitry to operate the memory element at some time prior to the cycle that the seed value is needed so that arrives at the LFSR and is installed at the correct time.

For any Scan controller with an N-bit LFSR, where N is greater than three, the present invention provides a logic circuit element cost savings. The present invention overcomes many of the disadvantages of the known prior art Scan controller that are stated above and can be more fully understood with reference to the FIGS. 1–6.

FIG. 1 illustrates a data processor 10 which has a test controller 12. The primary functions of the test controller 12 are to create and distribute scan test data, scan test sequence and control signals, and to collect scan response data which the test controller 12 conducts verification operations on. Once the test sequence is complete and the test response data has been verified, then the test controller indicates to a user/circuit/tester outside of the data processor 10 that the test has completed (by asserting the Test Done signal), so that external clock counting is not required, and also signals that the test has either passed or failed (by asserting the Test Good signal).

Figure 5:
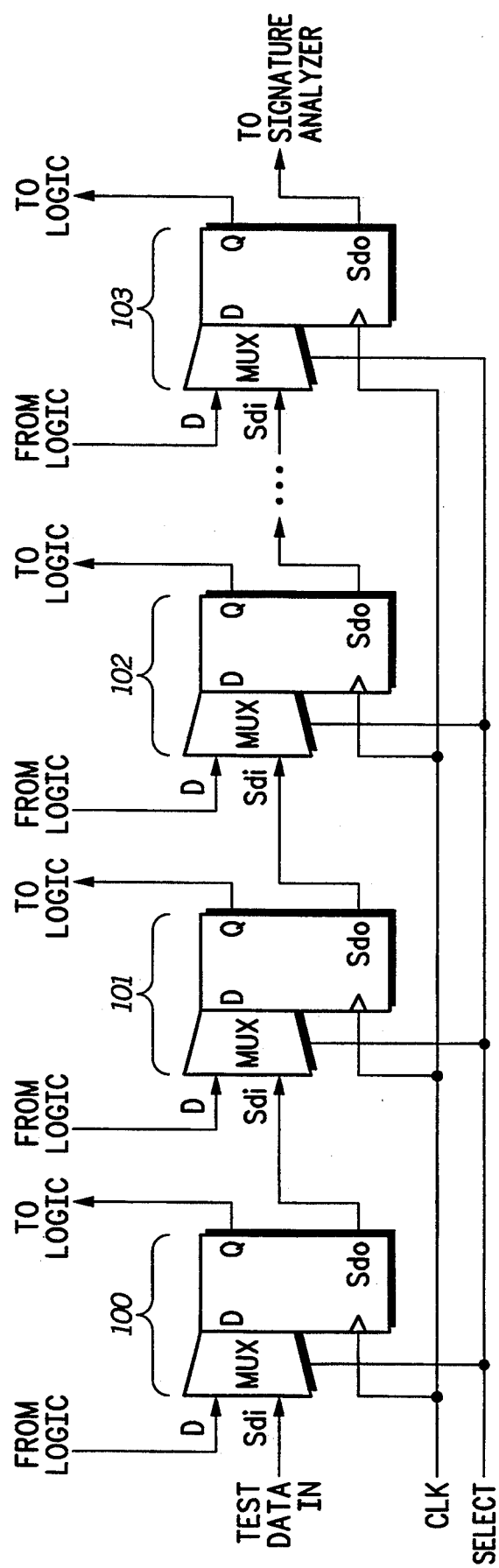
FIG. 5 illustrates, in a block diagram, a test circuit used by the data processing system, the test circuit being in accordance with the present invention.

The test controller 12 is coupled to a Central Processing Unit (CPU) 14 by scan sequencing and scan control signals and by scan generated data (SCAN DATA OUT) and scan response data (SIGNATURE DATA IN) signal lines. The automatically generated scan data originates from the test controller 12 and is applied to the processor 10 on the test controller's 12 SCAN DATA OUT signal lines (multiple scan chains may be operated simultaneously with identical or different data so this may be viewed as a bus of parallel scan generated data). Scan response data returns to the test controller from the CPU 14 on similar SIGNATURE DATA IN signal lines (where the number of signal lines equals the number of scan chains). The CPU 14 is the target of the scan testing and contains combinational logic and flip-flops which implement CPU functions such as pipelined execution units, integer and floating point execution units, memory array control and memory data interface units. All of the sequential elements (flip-flops) which are used to make these functional units are organized into scan chains (as shown in FIG. 5. elements 100–103) during any scan test mode.

The test controller 12 is also coupled to the Data Processor memory 16. The data processor memory 16 is the functional operational memory accessed by the CPU 14 to conduct functional operations. The memory 16 is coupled to the test controller 12 by scan sequence and scan control signals which are primarily used to prevent the memory 16 from passing indeterminate logic values to the D-input pins of the scan elements (flip-flops 100–103 of FIG. 5) contained in the CPU 14. This is necessary since scan data may be shifted through flip-flops that provide control and data to the memory 16 and will cause the memory 16 to conduct random read and write operations. The read and write operations may place data that is not pre-determined into combinational logic (by way of functional busses and functional signals) in the CPU 14 (such as random values installed during power-up or left over from functional operation before the entrance into a scan test mode). It is critical that indeterminate logic values are not factored into the scan response data so that the verification step is fully repeatable.

Figure 2:
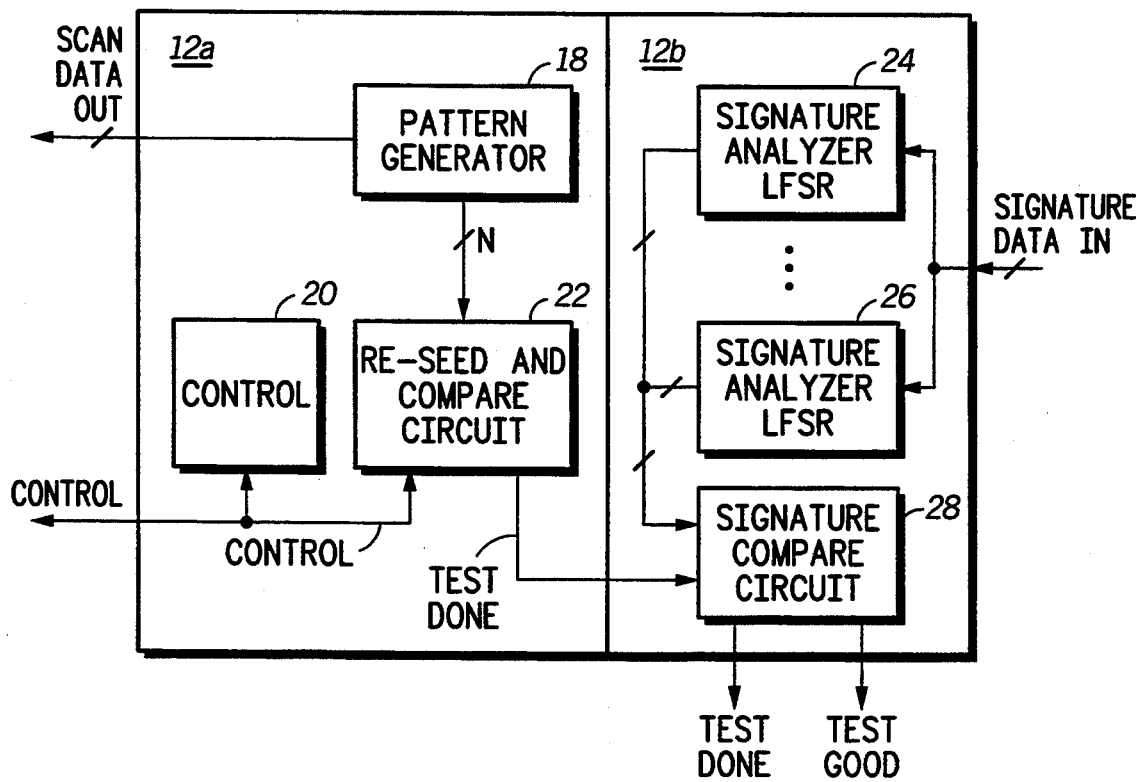
FIG. 2 illustrates, in a block diagram, a test controller for use in a data processing system, the test controller being in accordance with the present invention.

FIG. 2 illustrates the test controller 12 of FIG. 1 in more detail. The test controller 12 is divided into two test circuit portions, the pattern data and control signal generation unit 12a which is responsible for all of the output signals from the test controller, and the scan response data verification unit 12b, which collects all of the returned scan data from the CPU 14.

Figure 3:
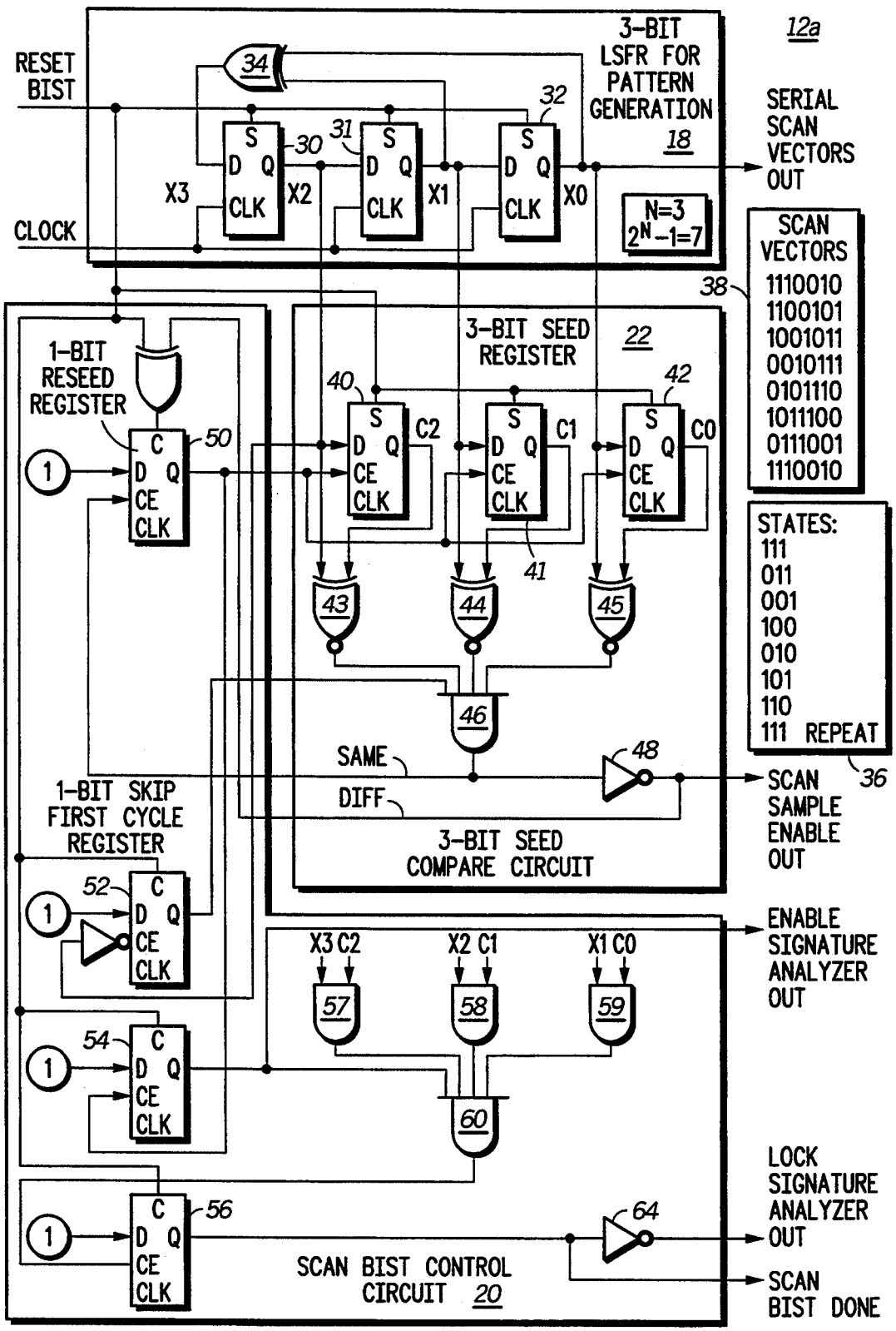
FIG. 3 illustrates, in a block diagram, a portion of the test controller of FIG. 2 in more detail, the portion of the test controller being in accordance with the present invention.

The pattern data and control signal generation unit 12a, which is shown in more detail in FIG. 3, includes a Pattern Generator 18, a Re-Seed and Compare Circuit 22, and a Control Signal Generation circuit 20. It is important to note in FIG. 3 that various interconnections between the CLK (clock) signal and the flip-flops, etc. are not illustrated in order to make FIG. 3 less complex to illustrate.

The pattern generator circuit 18 is a PseudoRandom Pattern Generator (PRPG) Linear Feedback Shift Register (LFSR) used to directly create the sequence of bits that will be used as the scan vectors and will also be the source of the LFSR seeds used for re-seeding the PRPG LFSR. The circuit 18 is now described in detail using FIGS. 2–3. The pattern generator circuit 18 is more accurately represented in FIG. 3 by the 3-bit sample circuit made of flip-flops 30–32 and exclusive-or gate 34 (NOTE: FIG. 3 shows a 3 bit implementation of the present invention so that the operation can be illustrated reasonably, in actuality the present invention implementation is based on more than three bits, such as 12-bits for example). The 3 bit example wherein N=3 can generate $[(2^N)-1]$ states which is equal to seven because the all-zero state is not entered. FIG. 3 illustrates pattern generator 18 with a CLOCK signal and a reset line used to restart/reset the circuit 18. The reset line into circuit 18 sets all the flip-flops 30–32 and 40–42 all to ones thereby making 111 the first seed value in circuit 18 and circuit 22.

The pattern generator 18 of FIGS. 2 and 3 will cycle through the states shown in box 36 of FIG. 3 thereby producing one 3-bit state on each active clock. Since the example circuit 18 of FIG. 3 is a three bit implementation, and a primitive polynomial is implemented via XOR gate 34 of FIG. 3 (wherein a primitive polynomial is an exclusive-or feedback network 34 that guarantees generation of every possible state except for the all 0's state), the PRPG LFSR will produce $2^N-1$ states, which is $(2^3=8)-1=7$ 3-bit states. A SERIAL SCAN VECTORS OUT port can be taken from the Q pin of any of the flip-flops 30–32 but is taken from flip-flop 32 in FIG. 3. If the SERIAL SCAN VECTOR OUT port is taken from a single Q output of the X0 flip-flop 32, then the cycling of the LFSR through the seven 3-bit states on seven active clocks will produce the seven serial bit sequence of 1's and 0's shown as the first line of box 38 in FIG. 3. It must be noted that the LFSR can not be placed in the all 0's state since this would continually force the LFSR to update to the all 0's state (an OR gate {not illustrated} can be used as an error detector to determine if the 0's state is ever entered in complex LFSR systems). Once the seed is changed as described above, the X0 output of flip-flop 32 outputs the second row of box 38 as a serial output, and so on, until all seven seeds have been used to generate the top seven lines of box 38 in FIG. 3. Once all seven seeds have been used in the circuit 18 to get seven rows of seven bit serial data streams, the circuit 18 can go back to the first original seed and start the process over once again. This repeating is illustrated by the fact that the seven-bit first serial data line of box 38 of FIG. 3 bit-for-bit matches the eighth line of the box 38.

A preferred form of the present invention uses a 12-bit implementation of the PRPG LFSR generator circuit 18 (instead of the illustrated 3-bit LFSR) since it will produce a serial stream of pseudo-random bits which is 4095 bits long. This length is necessary since the longest scan chain in most modern data processors is typically greater than 4000-bits long. The 12-bit circuit will cycle through all 4095 seeds to create a test that is effectively 4096×4096 (16,777,216) clock cycles long before repeating (where the scan sample cycles {the one ignored cycle for each of the 4096 seeds} are included in the count).

The Re-Seed and Compare Circuit 22 of FIG. 2–3 is now discussed in detail. The Re-Seed and Compare Circuit 22 is a register that is of equal length to the LFSR in circuit 18. In other words, the circuit 18 has 3 bits (3 flip-flops) and so the circuit 22 has three bits (i.e., three flip-flops). The re-seed and compare circuit 22 is a unit that captures a value from the LFSR and uses it as a compare value (the COMP field used above) to denote when the same value (i.e., the original seed value) re-occurs in the circuit 18. When this event happens it will end the sequence of bits (such as line one of seven bit in box 38 of FIG. 3) generated by that seed. The matching of LFSR values from circuit 18 and Re-Seed register values from circuit 22 are used by the Control Generation circuit 20 to create the various control signals needed by the target scan logic in processor 10 and the verification circuit in 12b. These signals are shown in FIG. 3 and are labeled "Scan Sample Enable Out", "Enable Signature Analyzer", "Lock Signature Analyzer" and "Scan Done".

The circuit 22 has an XNOR gate 43, an XNOR gate 44, and an XNOR gate 45 which are used to compare the stored 3-bit seed in flip-flops 40, 41, and 42 to the pseudo-random three-bit state in flip-flops 30–32 of FIG. 3. Once the stored 3-bit seed in flip-flops 40, 41, and 42 is equal to the pseudo-random three-bit state in flip-flops 30–32 of FIG. 3 after cycling past the initial loading of the seed in circuit 18, then AND gate 46 affects the control signals SAME and DIFF which allow the circuit 22 to restore a new seed in circuit 22, allow one clock cycle during which a new seed is loaded into circuit 18 to be ignored by circuitry external to circuit 12a via SCAN SAMPLE ENABLE OUT, and perform other functions described in detail below.

Figure 4:
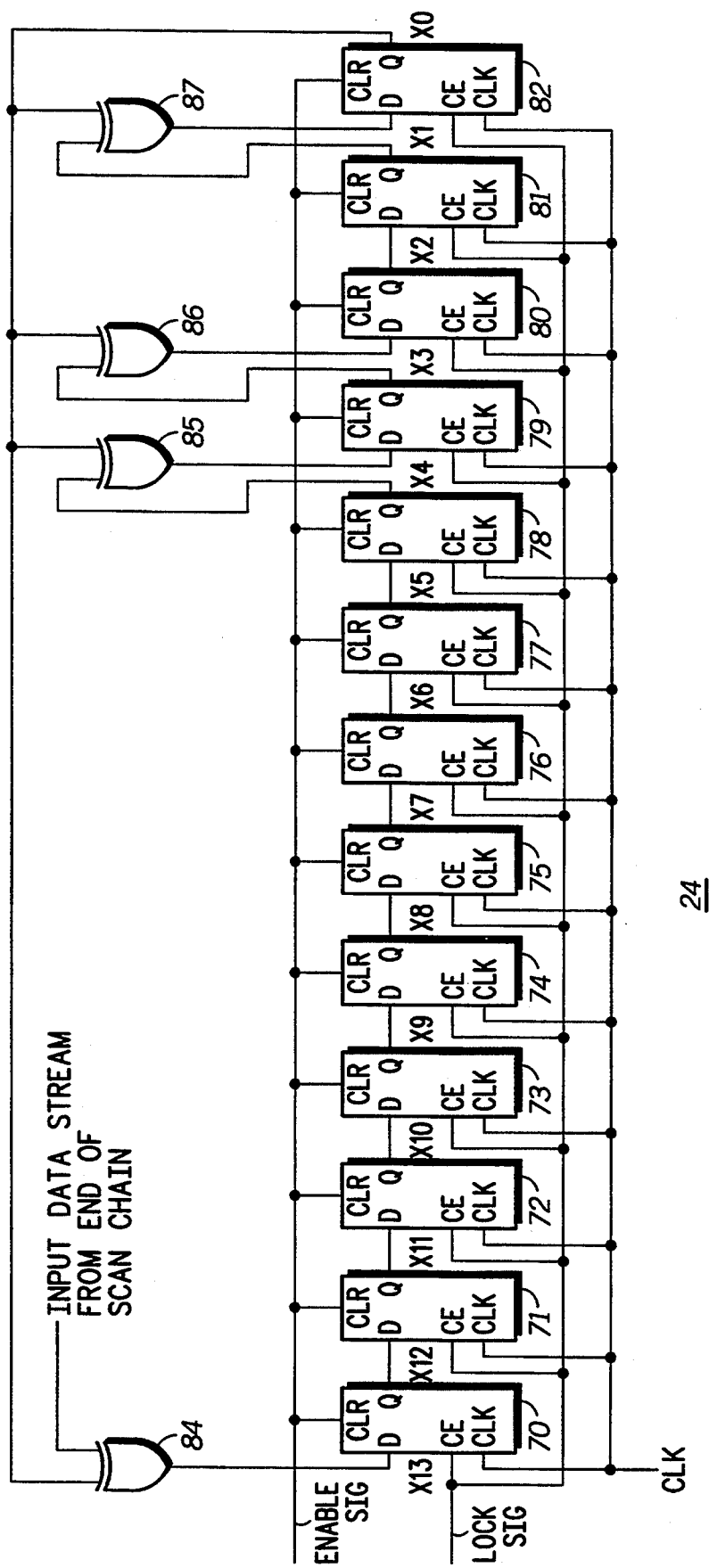
FIG. 4 illustrates, in a block diagram, another portion of the test controller of FIG. 2 in more detail, the another portion of the test controller being in accordance with the present invention.

Before discussing the control block 20 in detail from FIGS. 2–3, the circuit FIG. 12b needs to be described. In FIG. 2, element 12b shows a Scan Data Verification circuit which contains multiple signature analyzer LFSR's 24–26 (in practice, any number of signature analyzers from one to many may be used in FIG. 2). A preferred implementation of the current invention includes seven individual 13-bit LFSR Signature Analyzers wherein each 13-bit LFSR Signature Analyzer is constructed as illustrated in FIG. 4 and are connected to the last bit of each of the seven internal scan chains. Typically one signature is used for each scan chain in the processor 10 which can be any positive finite number (i.e., either one or a plurality).

Signature compare circuitry is a circuit that compares one or several or all of the signature analyzer LFSRs 24, 26, and 28 to predetermined signature values which are usually hard-coded into the circuitry 28 via connections directly to ground and Vdd. In other words, circuit 28 contains XNOR gates that compare the signature of each LFSR 24, 26, and 28 to the voltages GND and Vdd. For example, assume a working part will output 1101100010011 in the LFSR 24 for a given pattern generated by 18. Given the pattern has the same starting seed and algorithm each time it executes, the resulting value in LFSR 24 is the same value 1101100010011 every time the circuit is tested via circuit 12. Therefore, thirteen two-input XNOR gates have a first input wired to a unique one of the thirteen bits from LFSR 24 and have there second inputs wired to the correct one or zero (i.e., Vdd bus or GND bus). For example, for the signal 1101100010011, the 13th most significant XNOR gate is wired to Vdd, the second next significant XNOR gate is wired to Vdd, the third most significant XNOR gate is wired to GND, the fourth most significant XNOR gate is wired to Vdd, etc.. If the processor 10 fails the operation, then the bits in LFSR will not be 1101100010011 but instead be another value. The XNOR gates coupled with AND or NAND gates will then determine an error occurred by asserting or deasserting TEST GOOD.

The LFSRs 24, 26, and 28 may be individually tested for a correct signature (called a partial signature) to determine what 1/7th of the circuit failed or/and several or all of the LFSRs may be combined to output one TEST GOOD signal indicating whether the processor 10 is functional or has at least one functional error.

In addition, the resulting LFSR signatures used to compare in circuit 28 may be stored in a memory location or a plurality of memory locations within circuit 28 so that the comparing performed in 28 via XNOR gates is programmable and easily alterable.

FIG. 3, as indicated above, illustrates in more detail the three blocks/circuits contained within circuit 12a of FIG. 2, the pattern generator 18, the control generation circuit 20, and the re-seed and compare circuit 22. FIG. 3 is an example circuit implemented in 3-bits to more easily illustrate the operation of the whole unit. A preferred implementation of this current invention uses a 12-bit based circuit and even larger circuits are possible.

The pattern generator 18 of 12a is the section made up of the storage device (flip-flops) 30, 31, and 32 and the feedback exclusive-or (XOR) 34. The configuration of storage devices with a feedback exclusive-or (XOR) creates an LFSR where the exclusive-or's placement represents the polynomial $X^3+X^1+1$ (which is the decimal prime number value 11). The LFSR in circuit 18 needs a feedback path representing a prime number in order to iteratively generate all possible $[((2^N)-1)=7]$ 3-bit states. The LFSR in circuit 18, when started with a reset pulse, will install the first seed comprised of all 1's through the storage devices built-in set circuitry, and will change states on each active edge of the clock (the preferred form of the present invention uses the rising edge as the active edge, although level-sensitive or falling edge devices may be used).

The sequence of states that the LFSR storage device of circuit 18 will cycle through, for the maximal polynomial implemented by gate 34, is that shown in box 36. In this case the scan data supplied to the CPU 14 is taken from the Q output signal of flip-flop 32 (although it could be taken from the Q output of 30, 31 or 32, or it could be taken from all of them or a plurality of them in parallel). The state of flip-flop 32 as the LFSR cycles through the seven possible states is the top line shown in FIG. 38. This sequence of seven bits makes up one complete scan vector which exhaustively uses one seed value (for a larger implementation of this invention, a twelve-bit LFSR produces a sequence 4095 bits long instead of 7 bits long).

As the LFSR changes state with each clock cycle, the Q outputs of the storage elements 30-32 are also changing state and these values, labeled as X2, X1, and X0 in FIG. 3, are passed into the Re-Seed and Compare Circuit 22. This circuit is represented in FIG. 3 by the block 22 which contains the re-seed storage register (also known as the seed compare {COMP} register) made of flip-flops 40, 41, and 42; the compare XNOR gates 43, 44, and 45; the enable-compare AND gate 46; and the inverter 48. This circuit is enabled at the same moment that the LFSR of the pattern generator 18 is enabled by the reset signal. The storage devices 40-42 are set to all logic 1 through internal storage device set circuitry which matches the initial seed initially placed in the pattern generator 18 LFSR upon reset.

The output from the Q pins of storage elements 40-42 are bit-by-bit compared to the LFSR values X2, X1, X0 from the LFSR storage element Q pin values 30-32 by the exclusive-nor (XNOR) gates 43-45. When the two equal-length storage registers in circuit 18 and circuit 22 match (i.e., are equal), then the exclusive-nor gates 43-45 all indicate true (i.e., a logic one). The enable-compare AND gate 46 will create the signal named SAME if the skip first cycle register 52 in the scan control circuit 20 is true (this signal inhibits the matching of the seed and the seed compare circuit for the very first cycle when the seed value is first installed in the LFSR and the seed compare register).

When a legitimate seed compare occurs, then the LFSR of circuit 18 has cycled through all possible states as shown in block 36. The SAME signal is created, and passed through the inverter 48 to create the Scan Sample Enable Out signal. The Scan Sample Enable Out signal schedules the scan chains illustrated in FIG. 5 (which are the serially-linked clocked storage elements dispersed through the processor 10, previously discussed) to conduct a sample cycle and capture logic on the D input pins of storage elements 100-103 of FIG. 5. This sample cycle wherein the D input pin values are stored in FIG. 5 is caused by the Scan Sample Enable Out signal setting the SELECT signal to logic 0 in FIG. 5.

On the clock cycle when a match occurs between circuits 18 and 22, the SAME signal places a logic 1 value on the 1-bit re-seed register 50 which enables it to transmit a logic 1 value on the next active clock (the sample cycle). This logic 1 is used to schedule the seed compare register 40-42 to update and capture the value of the LFSR on the cycle after the sample cycle. In other words, referring to box 36 of FIG. 3, the Q bit out of register 50 allows circuit 22 to capture the value (011) which occurs after the previous seed (111) as the next seed value as discussed above.

When the seed stored in circuit 22 and the pseudo-random state in circuit 18 do not match, then the logic value from the compare enable AND gate 46 is false (logic 0) and the Scan Sample Enable Out signal is a logic 1 which schedules the scan chains illustrated in FIG. 5 to conduct shifting operations passing data from SDO to SDI of storage elements 100-103 by setting the SELECT signal to logic 1. The Scan Sample Enable Out signal is also the DIFF signal passed on to the SCAN Control Circuit 20. On the cycle after the scan sample cycle the DIFF signal transitions from a logic 0 to a logic 1 and this logic 1 clears the re-seed register 50 and cancels the scheduled update signal that would have caused the seed compare register 40-42 to change the value it captured from the LFSR on the cycle after the sample cycle (it allows the seed compare register 40-42 to hold the new seed until the LFSR repeats and matches it several iterations later).

In order for the Pattern Generator 18 to operate repeatedly and produce many different serial values, a Scan Control Circuit 20 is required to allow re-seeding of values other than all logic 1's which occurs on reset. In other words, repeating of the same seed is not acceptable. The circuit than ensures that a new seed which is different from the old seed is stored in circuit 22 is the 1-bit re-seed register 50, the 1-bit skip first cycle register 52, the enable final compare register 54, the done register 56, and the final compare AND gates 57-59, and the final compare-enable AND gate 60.

The 1-bit skip first cycle register 52 is a storage device that has a clock enable or hold state control to allow it to update only when the value placed on the CE pin is a logic 1 (a logic 0 placed on the inverter feeding this pin). When this occurs, the storage device will capture a logic 1 synchronous to the active clock signal (since the D pin is wired to a logic 1). This logic 1 enables the seed compare AND gate 46 in the seed compare block 22.

The skip first cycle register 52 will not update until the LFSR moves from the all 1's state (original seed) and places a logic 0 on the X2 output of LFSR storage element 30. As soon as this occurs, the skip first cycle register 52 will transition to an active state (logic 1) and will remain active until the reset signal transitions again thereby enabling the compare enable AND gate 46 to create the SAME signal every time the seed compare register 40-42 matches the LFSR value 30-32. The skip first cycle register 52 is also cleared to an inactive state (logic 0) when the reset signal is invoked so that, on the very first cycle, when the LFSR and the seed compare register 40–42 match due to the placing of default initial seed 111 installed by the reset signal, the SAME signal is inhibited. The seed should not be replaced on the clock cycle in which it is initially loaded. This forces the seed compare register 40–42 to hold the 1's state during this very first cycle and then generate the 7 pseudo-random states until the 111 occurs again.

The 1-bit re-seed register 50 is a storage device that has a clock enable or hold state control to allow it to update only when the value placed on the CE pin is a logic 1. When this occurs, the storage device will capture a logic 1 synchronous to the active clock signal (since the D pin is wired to a logic 1). This logic 1 enables the seed compare register 40–42 to capture the value on the Q outputs labeled X2, X1, X0 of the LFSR in circuit 18 on the next active clock. This register 40–42 is only enabled for update when the LFSR and the seed compare register 40–42 match. It then, once a match is determined, updates on the active clock that is the sample cycle. As soon as the LFSR (flip-flops 30–32) of circuit 18 and the seed compare register 40–42 no longer match, the exclusive-nor gates 43–45 and the compare enable AND gate 46 will produce the SAME=false (logic zero) signal which will create the DIFF=true (logic one) signal through the inverter 48. These signals schedule the re-seed register 50 to clear which removes the clock enable signal from the seed compare register 40–42 thereby correctly latching a new seed from the circuit 18. The re-seed register 50 is also cleared when the reset signal is invoked so that the seed compare register 40–42 will not update from the all 1's default initial seed.

The enable final compare register 54 is a storage device that has a clock enable or hold state control to allow it to update only when the value placed on the CE pin is a logic 1. When CE=1 for register 54, the storage device will capture a logic 1 synchronous to the active clock signal (since the D pin is wired to a logic 1 {Vdd} in FIG. 3). This logic 1 output from register 54 enables the final compare enable AND gate 60 to pass on the final compare value created from the final compare AND gates 57–59 and generates the enable signature analyzer out signal by passing the Q output pin value through the inverter 64. The assertion of the enable signature analyzer out signal only occurs after the first translation of the re-seed register 50. The first translation of the re-seed register 50 indicates that the first LFSR cycle through the first seed has completed. This event signifies that the initial random or non-deterministic state held in the scan chains 100–103 has been shifted out and replaced with valid deterministic data. In general, the output of the register 54 indicates to the signature analyzer of FIG. 4, via an ENABLE SIG signal, that the SIGNATURE DATA IN of FIG. 2 is valid and should be stored. The initial first set of data on the SIGNATURE DATA IN lines of FIG. 2 are indeterminate and the data within the analyzers 24, 26, and 28 are indeterminate since the original state of the processor 10 before data is shifted into the flip-flops of the data processor 10 by the circuit 12, is typically random/unpredictable/unrepeatable. This data from SIGNATURE DATA IN can be captured by one or more of the signature analyzers 24, 26, and 28 on all future clock cycles once ENABLE SIG gives a known/repeatable state to the signature analyzers 24, 26, and 28 in FIG. 2.

The final compare enable AND gates 57–59 are used to identify when the initial seed of all 1's occurs in the LFSR and the re-seed register 40–42 for the third time (the first time is when the reset signal is invoked to install the 111 seed value initially, the second time is the match of the first seed). The third 111 seed occurs after the LFSR of circuit 18 has used all seven seeds and output lines one through seven from box 38 via X0. In other words, the seeds stored in circuit 22 will transition as illustrated in box 36 wherein the first value 111 is the initial seed via the reset and the eighth value is the repeat of the 111 seed which is detected via gates 57–60. The all 1's state will bit-by-bit compare as true when the LFSR state values of X2, X1, and X0 match the Q pin values of the seed compare register 40–42. If the Final compare enable AND gate 60 is enabled via Q of register 54 (which is disabled when the initial seed 111 is loaded into circuit 12), then the true compare value is passed on to enable the done register 56.

The done register 56 is a storage device that has a clock enable or hold state control to allow it to update only when the value placed on the CE pin is a logic 1. When CE=1 for register 56, the register 56 will capture a logic 1 synchronous to the active clock signal (since the D pin is wired to a logic 1 in FIG. 3). This logic 1 creates the scan done signal which indicates to a user outside of the data processor that the test has completed. The translation of the done register 56 also stops the signature analyzers from updating by placing a logic 0 on the lock signature analyzer out signal (in FIG. 3) or LOCK SIG (in FIG. 4) by passing the done signal through inverter 64. In the present invention there are 7 signature analyzers (one for each scan chain) which all operate in a parallel fashion in that they are all enabled and they all lock simultaneously on the commands from the scan control circuit 20.

FIG. 4 illustrates the structure of a single signature analyzer 24, 26, or 28 in more detail. The signature analyzer of FIG. 4 is made of storage devices 70–82 that incorporate clock enable or hold state control capability. The signature analyzer is basically a shift register that incorporates feedback by adding a feedback term taken from the end of the shift register and mixing it back into internal stages through exclusive-or's 84–87. This has the effect of creating a divider (a shift right is a modulo divide-by-two logic operation) that has a divisor different than two. The feedback terms represent the change in divider basis by an applied polynomial. In the case of FIG. 4 the polynomial can be read right from the placement of the feedback terms as $X^{13}+X^4+X^3+X^1+1$ which is converted to a decimal prime number by $8192+16+8+2+1=8219$. This means that the signature analyzer acts as a divider which in this case repeatedly divides the incoming binary data stream and the binary number in the flip-flops of FIG. 4 by the prime number 8219. The remainder of the divide operation is the state that exists in the LFSR signature analyzer. The signature analyzer of the present invention was chosen to be 13-bits in length to minimize aliasing (an effect that can occur if 2 or more errors have the result of canceling each other out and producing a signature that is exactly equal to a correct signature response).

The signature analyzer 24 is cleared to the all 0's state as long as the ENABLE SIG signal, output via FIG. 3 by enable signature analyzer out, is a logic 1. This enable signal is connected to the enable signature analyzer out signal that comes from the scan control circuit 20.

This enable signal will not transition to a logic 0 state, which will enable the signature analyzer to update repeatedly on each active clock, until the pattern generator LFSR 18 has processed one complete seed and has flushed the non-deterministic values from the scan chains 100-103 as discussed previously. Once the signature analyzer is enabled, the scan chain will shift a new value on each active clock into the exclusive-or 84. The resultant value will be shifted into the signature analyzer storage element labeled X13 on the next active clock. The signature analyzer will continue to update and change values until the LOCK SIG signal (provided via the lock signature analyzer out of FIG. 3) translates from logic 1 to logic 0. The lock signal is connected to the lock signature analyzer out signal that comes from the scan control circuit 20. The lock signal enables the lock state when the pattern generator LFSR state in flip-flops 30-32 matches the seed compare register state 40-42 for the second time.

When the scan done signal from the scan control circuit 20 transitions, then the signature analyzers lock up (hold their values) and these values are then compared to known values in the signature compare circuit 28. The scan done signal is passed out of the block as the TEST DONE signal to indicate to an external user that the test has completed (so the user does not have to conduct external clock counting). If the signature analyzer value matches a pre-encoded value in the signature compare circuit 28, then the TEST GOOD signal transitions indicating a pass condition. If the signature analyzer value does not match the pre-encoded value, then the TEST GOOD signal does not transition which indicates a fail condition.

The example scan chain shown in FIG. 5 is comprised of functional CPU 14 flip-flops 100-103 (one preferred form of the present invention is a CPU comprised of more than 13,000 flip-flops separated into 7 serial scan chains). When the circuit is not in scan or test modes, the flip-flops act as regular D-type flip-flop storage elements and capture data that is presented on their D pins and pass this on to the Q pins on the active edge of the clock. The functional flip-flops 100-103 are all connected into a serial scan chain when the select line (fed into the MUXs in FIG. 5) is set to a logic 1. The select being equal to one maps each flip-flop of FIG. 5 so that it connects to the scan data in (SDI) port of one of it's neighbors so that a serial scan shift chain is formed. When this occurs, the data present in each flip-flop is shifted from the SDI to the SDO port within each flip-flop 100-103. The data sent into the flip-flops via the SDI/SDO ports is data from the pattern generator 18 (which would be connected to element 100, or the first element in the scan chain). Also, the output of SDO of flip-flop 103 or the last flip-flop in the scan chain is coupled to the signature analyzer 24 to collect processor state information resulting from the data initially shifted into the flip-flops and processed via clock cycles and the test circuit 12.

In the sequence of events that occur during scan testing, all of the scannable flip-flops in an integrated circuit are loaded with a state by shifting in test values from circuit 12 while the select line is a logic 1, and then this shifted-in state causes combinational circuitry in processor 12 to respond with a response state. The response state is captured during the sample cycle by setting the select signal to logic 0 in FIG. 5. If the test is applied at the rated frequency, then the logic can be graded for transition speed and AC (timing based) faults. If the test is applied at the rated frequency or below, and the state of the scan chain has been determined specifically to excite certain combinational gates, then the response can verify the truth table description of those gates. This is known as a stuck-at test since a failing test will be the result of a node or gate acting as if an input, output, or wire connection was stuck-at a logic value of 1 or 0. If the test is applied and the sample cycle is conducted twice (the select signal is held at logic 0 for two consecutive cycles), then the response of the functional logic will be that of speed grading specific combinational logic paths.

Figure 6:
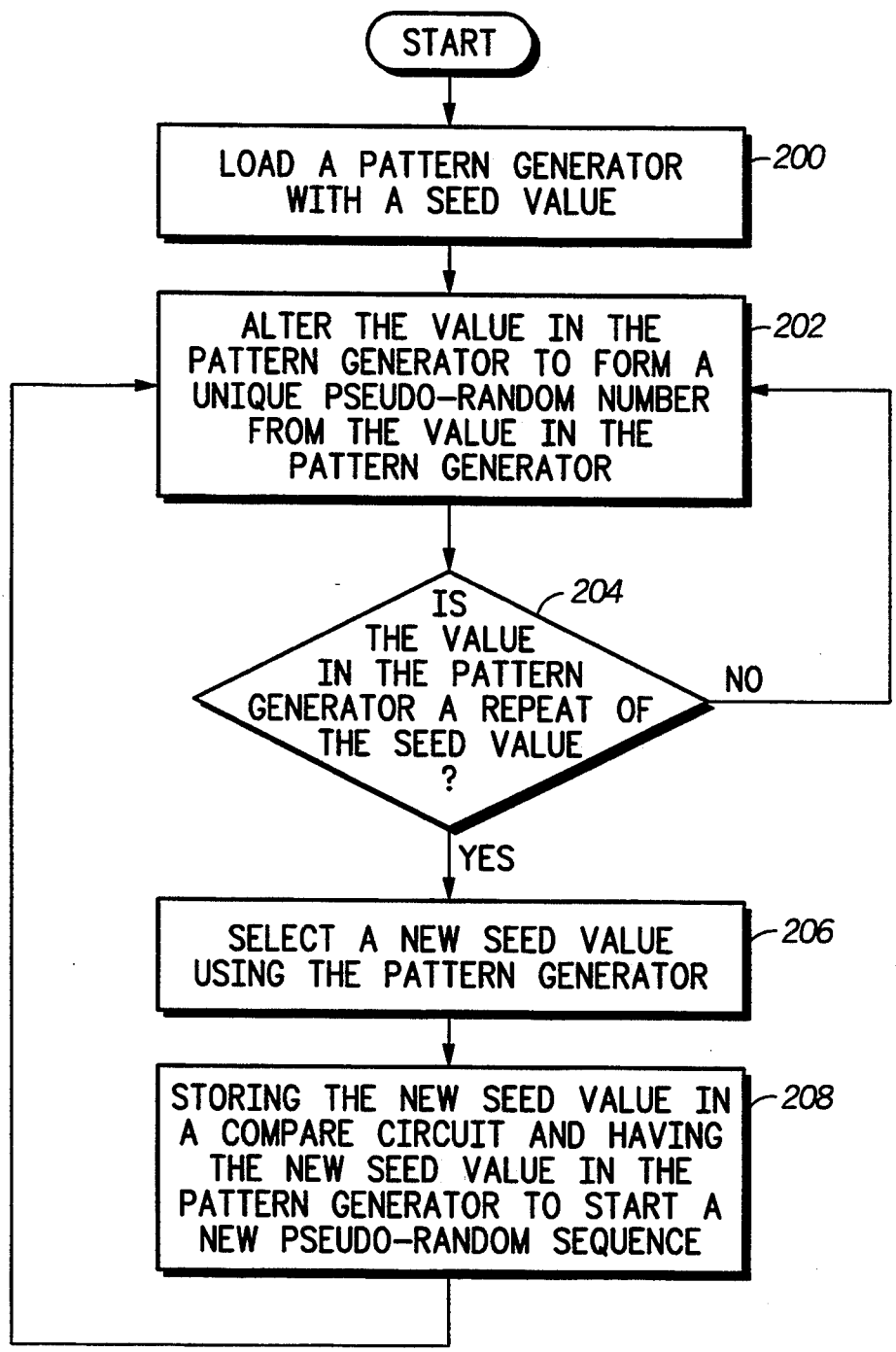
FIG. 6 illustrates, in a flowchart, a method for generating pseudo-random numbers, the method being in accordance with the present invention.

FIG. 6 illustrates the flow of the test sequence in it's normally occurring order. The test begins in the start block and physically is represented by the transitioning of the reset signal. This brings the sequence into block 200 which is the effect of the reset signal, which is to install the initial seed value of all 1's into the PRPG LFSR and to preset all of the control signals and load the seed compare register with the all 1's value. As soon as the active clock transitions, the sequence moves to block 202 and the value in the PRPG LFSR has changed due to the built in polynomial and feedback terms. This value is then compared to the stored value in the seed compare register shown in step 204. If the match is false, then the sequence returns to step 202 and the PRPG LFSR is allowed to update again via the polynomial and feedback terms. The steps 202-204 continues until the value matches in step 204 via the seed being repeated in the circuit 18. At this point, the sequence moves into block 206 where the seed compare register selects the seed value that occurs on the cycle after the scan sample. The step 208 is the actual capturing of the state of the PRPG LFSR that occurs after the sample cycle which effectively starts the PRPG LFSR and the seed compare register in the same state to process another sequence depicted by a return to step 202. This sequence of steps can actually continue endlessly unless a final ending condition is stipulated which could be illustrated with a block similar to 204 that states, "is the value in the pattern generator a repeat of the initial seed value from step 200 for the second time". Any other condition could also be imposed.

The present invention provides a method for generating pseudo-random numbers in a self re-seeding fashion. The present invention also provides an apparatus for providing a plurality of pseudo-random numbers in a self re-seeding fashion in either parallel or serial form and provides signals which may be used to control and sequence scan testing operations. With such circuits, systems, and methods as taught herein, a complete Built-In-Self-Test (BIST) for a scan architecture can be orchestrated, sequenced, controlled, and accomplished with a minimum logic impact to the integrated circuit die area, and a minimal impact to the performance of the functional logic of the microprocessor.

The current invention provides the ability to conduct a complete scan in a self-contained minimal logic and area cost circuit as compared to the current known art in this field. The key to this logic savings is the fact that the present invention is self re-seeding. Being a self re-seeding implementation means that the LFSR itself produces the $2^N-1$ possible seeds from values that it generates, rather than having to store these seeds in a memory element or create them with a separate counter or state machine. This also means that the LFSR automatically signals when it has completed a seed rather than having another counter evaluate when the LFSR has applied all of the state values possible for a given seed (and the end of seed indication is also the signal that controls the scan architecture to implement the sample cycle wherein D input data of flip-flops is latched). Due to this sharing of functionality and logic, the self re-seeding design has an overall logic cost saving of at least one equal length (equal to the length of the LFSR) register.

Since the current invention does not have to schedule memory operations to retrieve seeds or polynomials from a memory storage element, and since the sequence complexity of the re-seeding operation could be classified as being easier to perform than known techniques, the current invention can operate the scan at the rated clock frequency (if the scan architecture is designed to support it). The operators and controllers of the known art have fairly complex seeding strategies and sequence timing limitations associated with fetching seeds and polynomials from memory storage elements, and timing the sequence of operations with counters which can place a frequency of operation limitation on them.

Known art that does not seed or change polynomials can operate at rated frequency, but can only operate the LFSR through a single seed. This provides a much less effective test than the current self re-seeding method of the invention (for example a 3-bit LFSR operated once will produce 7 different states which will in turn produce a unique 7-value bit stream, whereas a 3-bit self re-seeding LFSR will produce 7×7 different states which will in turn produce a unique 49-value bit stream using comparable hardware). Even if the single seed LFSR is operated multiple times, it will only produce the same exact bit sequence over and over again as compared to the self re-seeding LFSR which will produce a different sequence for each seed value.

Another advantage of the self re-seeding LFSR used as a controller is that it is self limiting. The known art PRPG LFSR's must have counters or state machines to identify when the repeat point of the LFSR state occurs. This is straight forward for a maximal polynomial which is guaranteed to supply $2^N-1$ (N is the number of bits in the LFSR) states, but becomes a complex problem for non-maximal polynomials (a polynomial which will cause the LFSR to repeat it's sequence in less than $2^{N1}-1$ states and whose repeat cycle count depends on the seed value). This means that each seed applied to an LFSR has a different cycle count which must be tracked by an external counter or state machine. The self re-seeding LFSR automatically identifies when it repeats regardless of the polynomial used and will automatically install the next seed at the correct point. This is very advantageous in some designs.

One of the most significant advantages of the self re-seeding LFSR based controller circuit, is that it automatically generates all of the control signals needed to conduct a complete scan test, or can create the needed signals with minimal logic additions. In the known art implementations of LFSR based scan controllers, the control signals are a logic block entirely separate from the LFSR, or they are required to be supplied externally from a test device (the LFSR only produces vectors—scan operations are still scheduled as a separate function which may come from an external tester or another internal logic unit).

To summarize, the current invention accomplishes a logic savings over the current known art by using the LFSR and seed compare (COMP) register themselves as the engine to replace much additional circuitry. This engine-when used as a complete scan controller, automatically produces all control signals needed to: operate the scan chains; schedule seeds; gauge the length of operation per seed; and operate and disable the signature analyzers, and all of these operations can occur at the rated frequency of the part if the scan chain has been designed to support such operation.

While the present invention has been shown and described with reference to specific embodiments, further modifications and improvements will occur to those skilled in the art. For example, the LFSR in the current invention is a 12-bit implementation with a specific polynomial encoding which requires an equal length (12-bit) seed compare register. This device could be made any length that is needed to supply scan vectors (the length is actually related to the length of the longest scan chain—scan chains that are 4095-bits or less can be filled with a 12-bit PRPG generator; greater than 4095 but less than 8191 can be filled with a 13-bit generator). Also, this device could be naturally encoded with any default polynomial (maximal or otherwise) and could be started with any seed other than the all 1's state.

In the current invention, the scan vector stream is taken from the last bit (Least Significant Bit) of the PRPG LFSR, a useful modification is to take a scan bit stream from any LFSR output point (Q pin). If multiple scan chains are operated, then each input to a scan chain may be connected to a different output point in circuit 18 (this is viewed as a parallel vector source bus, as opposed to the serial vector source bus coming from the end point, which is the X0 value of the PRPG LFSR, and it can be any width up to the number of bits contained in the LFSR). The output stream can also, be taken directly from the individual LFSR outputs such as X0 or X1 or gated together to provide mixed outputs (i.e. outputs X0 and can be combined through a combinational gate to provide the resulting bit output).

Another significant modification has to do with the type of flip-flop or latches supported in both the scan chain and the controller circuit. In the current invention, the scan chains are primarily a multiplexed positive edge triggered scan flip-flop which allows functional circuit information to be captured on the D pin when the select line (scan enable) is in the logic 0 position, and allows scan shifting to occur when the select line is in the logic 1 position. Different types of storage elements can be used such as clocked scan flip-flops, separated master-slave latches, and flip-flops or latch combinations with the scan multiplexor between the master and slave or after the internal Q output. The controller of the current invention uses positive edge triggered flip-flops with set, clear and a data gate (clock enable, hold control, or data enable). This type of flip-flop can be replaced with any kind of flip-flop and circuitry that could evoke the same response. This means the set or clear function can be generated by gates and fed into the D pin; the hold function can be accomplished by either feeding back the Q output to the D input through a multiplexor, or by withholding the clock; that the latching element can be a D, T, RS, JK, or other kind of storage device. Also, to generate some of the control signals which are created by inverters in the current invention, a storage device with a Q output could be used instead.

Other modifications that are possible are: the addition of an OR or NOR gate to the PRPG LFSR that combines all of the Q-outputs into a single signal that can be used to detect the error state of all 0's; the usage of different configurations of signature analyzers (multiple parallel inputs with feedback from the end only, multiple parallel inputs with feedback distributed through the middle stages, single serial input with feedback from the end only, and single serial input with feedback distributed through the middle states) that can be any bit length; esoteric multiples of the PRPG LFSR control circuit such as two or more PRPG LFSRs with different initial seeds supplying multiple scan chains; and the ability to run the entire test more than once by including the ability to match the initial state more than two times (adding a count stage for the final enable or done signal that requires returning to the initial seed more than some cutoff value). It is to be understood, therefore, that this invention is not limited to the particular forms illustrated and that it is intended in the appended claims to cover all modifications that do not depart from the spirit and scope of this invention.

What is claimed is:

1. A data processing system comprising:
   circuit means for manipulating data having digital storage devices;
   a first storage device coupled to the circuit means for manipulating data, the first storage device having N bits and generating a set of M unique logic values in a cyclic manner wherein $2 \leq M \leq 2^N$; and
   a second storage device having N bits which stores one of the M unique logic values from the first storage device as a seed value and recognizes when the seed value repeats in the first storage device, the second storage device stores a different one of the M unique logic values from the first storage device as a new seed value when the seed value repeats.

2. The data processing system of claim 1 wherein the second storage device allows the first storage device to experience at least one full clock cycle after the seed value repeats and stores in the second storage device the value resulting from the at least one full clock cycle as the new seed value.

3. The data processing system of claim 2 wherein the second storage device generates a control signal which disables the use of the N bits from the first storage device during the at least one full clock cycle.

4. The data processing system of claim 2 wherein the second storage device generates a control signal which disables the use of the N bits from the first storage device from the time the seed value repeats until the new seed value is stored in the second storage device.

5. The data processor of claim 1 wherein the first storage device is a linear feedback shift register (LFSR) having N distinct flip-flops wherein at least one logic gate is coupled between and output of at least one of the N distinct flip-flops to and input of at lest one of the N distinct flip-flops.

6. The data processor of claim 1 wherein the first storage device is a linear feedback shift register (LFSR) wherein the N bits stored in the first storage value are divided by a primitive polynomial via each clock cycle.

7. The data processor of claim 1 wherein the first storage device is initiated to a first of the M unique logic values via a reset control signal.

8. The data processor of claim 1 wherein compare logic coupled to both the first storage device and the second storage device generates a first control signal which indicates when the seed value repeats in the first storage device.

9. The data processor of claim 8 wherein the second storage device is coupled to a control storage device having an input for receiving the first control signal, the control storage device being used to generate a second control signal, the second control signal being used to enable second storage device to the store said different one of the M unique logic values from the first storage device.

10. The data processor of claim 1 wherein a signature analyzer is coupled to the data processor for determining errors is system data resulting from the application of the M unique logic values to portions of the data processor.

11. A data processing system comprising:
    circuit means for manipulating data having digital storage devices;
    a first storage device coupled to the circuit means for manipulating data, the first storage device having N bits and generating a sequence of up to $\{(2^N)-1\}$ unique binary values wherein each of the up to $\{(2^N)-1\}$ unique binary values is generated once before any of the up to $\{(2^N)-1\}$ unique binary values are repeated in the sequence, a first value in the sequence of up to $\{(2^N)1\}$ unique binary values being considered a seed value; and
    a second storage device having N bits which determines when the seed value has repeated in the sequence and allows the first storage device to select a new seed value and begin a new sequence of up to $\{(2^N)-1\}$ unique binary values.

12. The data processing system of claim 11 wherein the circuit means for manipulating data is a device selected from a group consisting of: a memory array, an execution device, a central processing unit (CPU), and a pipeline execution unit.

13. The data processing system of claim 11 wherein the first storage device is coupled to a signature analyzer circuit for providing a signature value, the signature value determining if the circuit means for manipulating data is operating properly.

14. The data processing system of claim 11 wherein the first storage device outputs at least one stored bit via at least one bitline, the at least one bitline being coupled to a plurality of serially connected storage devices wherein the at lest one bitline transfers the at least one stored bit to the plurality of serially connected storage devices to determine if the plurality of serially connected storage devices and any logic coupled to the plurality of serially connected storage devices are functioning properly.

15. A method for providing a sequence of pseudo-random bits comprising the steps of:
    (a) loading a first storage circuit with a seed value;
    (b) altering the seed value in the first storage circuit in a manner which allows the first storage value to generate N pseudo-random bit values starting from the seed value, the N pseudo-random bit values eventually reaching a point in time where the N pseudo-random bit values repeat;
    (c) detecting when the seed value is repeated in the first storage circuit via a second storage circuit;
    (d) allowing the first storage circuit to clock at least once to select a next seed value within the first storage circuit;
    (e) storing the next seed value in the second storage circuit; and
    (f) repeating steps (b) through (e) a predetermined number of times.

16. The method of claim 15 wherein the step (b) further comprises communicating the N pseudo-random bit values to a circuit for testing of a functionality of the circuit.

17. The method of claim 16 wherein the step (b) further comprises providing the N pseudo-random bit values in a format wherein the format is selected from a group consisting of: parallel communication, serial communication, and a combination of parallel and serial communication.

18. A pseudo random pattern generator comprising:
N first flip-flops for storing a beginning seed value and altering the beginning seed value to output a sequence of pseudo-random bits in a manner wherein the beginning seed value eventually repeats in time within the N first flip-flops, N being a positive finite integer;
N second flip-flops coupled to the N first flop-flops for selectively storing the beginning seed value from the N first flip-flops and storing a new seed value from the N first flip-flops wherein the new seed value is unequal to the beginning seed value, the new seed value being stored in response to the repeating of the beginning seed value in the N first flip-flops, the new seed value replacing the beginning seed value in the N first flip-flops; and
compare circuitry coupled to the N second flip-flops and the N first flip-flops for comparing the pseudo-random bits from the N first flip-flops to the beginning seed value stored in the N second flip-flops and storing one set of pseudo-random bits from the N first flip-flops to the N second flip flops to replace the beginning seed value with the one set of pseudo-random bits, the one set of pseudo-random bits being the new seed value.

19. The data processing system of claim 18 wherein the compare circuitry has a control signal which allows the N first flip-flops to experience at least one full clock cycle after the beginning seed value repeats in the N first flip-flops and allows the N second flip-flops to store the new seed value, the new seed value being a set of pseudo-random bits which results in the N first flip-flops after receiving the at least one full clock cycle after the beginning seed value repeats.

20. The data processing system of claim 19 wherein an output of the N first flip-flops is coupled to circuitry which requires testing and provide the sequence of pseudo-random bits to the circuitry which requires testing.

21. The data processing system of claim 20 wherein the output of the N first flip-flops which is coupled to circuitry, which requires testing is disabled when the at least one full clock cycle after the beginning seed value repeats is being received by the N first flip-flops.

22. A storage device comprising:
N first flip-flops, each flip-flop having an input and an output, where N is a positive finite integer;
N second flip-flops each having an input coupled to a unique output of the N first flip-flops and an output for each of the N second flip-flops; and
compare circuitry coupled to both the outputs of the N second flip-flops and the outputs of the N first flip-flops for comparing a first current value on the outputs of the N second flip-flops to a second current value on the outputs of the N first flip-flops, wherein if the first current value is equal to the second current value, then the first current value stored in the N second flip-flops is changed to a new value from the N first flip-flops wherein the new value is different from the first current value.

23. A test circuit comprising:
a pseudo-random number generator circuit having an input and an output;
a reseeding circuit comprising:
a capture register; and
a compare circuit for comparing the output of the pseudo-random number generator circuit to the capture register for determining when the pseudo-random number generator circuit is about to repeat a first set of pseudo random numbers for a second time, the reseeding circuit changing a value stored in the capture register to enable the pseudo-random number generator circuit to output a second set of pseudo random numbers which is in a different order than the first set of pseudo random numbers; and
a plurality of serially-connected flip-flops coupled to the output of the pseudo-random number generator circuit for receiving a serial stream of pseudo random bits.

* * * * *